(12) United States Patent
Fam et al.

(10) Patent No.: US 7,492,312 B2
(45) Date of Patent: Feb. 17, 2009

(54) MULTIPLICATIVE MISMATCHED FILTERS FOR OPTIMUM RANGE SIDELOBE SUPPRESSION IN BARKER CODE RECEPTION

(76) Inventors: Adly T. Fam, 1206 Charlesgate Cir., East Amherst, NY (US) 14051; Indranil Sarkar, 267 Robert Dr., Apt #3, North Tonawanda, NY (US) 14120

( * ) Notice: Subject to any disclaimer, the term of this patent is extended or adjusted under 35 U.S.C. 154(b) by 192 days.

(21) Appl. No.: 11/559,776

(22) Filed: Nov. 14, 2006

(65) Prior Publication Data
US 2008/0111734 A1    May 15, 2008

(51) Int. Cl.
*G01S 13/00* (2006.01)
(52) U.S. Cl. .......... 342/159; 342/195; 342/39; 342/379
(58) Field of Classification Search ........ 342/159, 342/195, 379, 39
See application file for complete search history.

(56) References Cited

U.S. PATENT DOCUMENTS

| | | | |
|---|---|---|---|
| 4,095,225 A | | 6/1978 | Erikmats |
| 4,156,876 A | | 5/1979 | Debuisser |
| 4,313,170 A | | 1/1982 | Lewis et al. |
| 4,566,010 A | | 1/1986 | Collins |
| 5,070,337 A | * | 12/1991 | Chen et al. .......... 342/201 |
| 5,760,732 A | | 6/1998 | Marmarelis et al. |
| 5,786,788 A | | 7/1998 | Schober et al. |

OTHER PUBLICATIONS

A.W. Rihaczek & R.M. Golden, "Range sidelobe suppression for Barker codes," IEEE Transactions on Aerospace and Electronic Systems, vol. AES 7, No. 6, Nov. 1971, pp. 1087-1092.*

R.C. Daniels & V. Gregers-Hansen, "Code inverse filtering for complete sidelobe removal in binary phase coded pulse compression systems," Proceedings of IEEE International Radar Conference, May 2005, pp. 256-261.*

A.W. Rihaczek & R.M. Golden, "Range sidelobe suppression for Barker codes," IEEE Transactions on Aerospace and Electronic Systems, vol. AES 7, No. 6, Nov. 1971, pp. 1087-1092.

M.H. Ackroyd & Ghani, "Optimum mismatched filters for sidelobe suppression," IEEE Transactions on Aerospace and Electronic Systems, vol. AES 9, No. 2, Mar. 1973, pp. 214-218.

(Continued)

*Primary Examiner*—Thomas H Tarcza
*Assistant Examiner*—Timothy A Brainard

(57) ABSTRACT

Very efficient sidelobe suppression of Barker codes is achieved through the use of a mismatched filter, which is comprised of a conventional matched filter cascaded with a computationally efficient filter based on multiplicative expansion. Several constant parameters are introduced in the terms of the expansion and are optimized to improve the performance of the filter. Optimized mismatched filters for length 13, 11, 7 and 5 Barker codes are presented. For each of these codes, filters with one, two and three stages are studied. The technique is extended to compound Barker codes based on their representation in a factored form in the z-domain. Hardware requirements for the filters discussed in the disclosure are also presented.

16 Claims, 5 Drawing Sheets

OTHER PUBLICATIONS

S. Zoraster, "Minimum peak range sidelobe filters for binary phase coded waveforms," IEEE Transactions on Aerospace and Electronic Systems, vol. AES 16, No. 1, Jan. 1980, pp. 112-115.

M.H. Ackroyd, "Economical filters for range sidelobe reduction with combined codes," The Radio and Electronic Engineer, vol. 52, No. 6, Jun. 1982, pp. 309-310.

H. Rohling & W. Plagge, "Mismatched filter design for periodical binary phased signal," IEEE Transactions on Aerospace and Electronic Systems, vol. AES 25, No. 6, Nov. 1989, pp. 890-897.

Chen Xiao Hua & Juhani Oksman, "A new algorithm to optimize Barker code sidelobe suppression filters," IEEE Transactions on Aerospace and Electronic Systems, vol. AES 26, No. 4, Jul. 1990, pp. 673-677.

G.E. Coxson, A. Hirschel & M.N. Cohen, "New results on minimum -PSL binary codes," Proceedings of the 2001 IEEE Radar Conference, Atlanta, GA, May 2001, pp. 153-156.

A.T. Fam, "MFIR filters: Properties and applications," IEEE Transactions on Acoustics, Speech and Signal Processing, vol. ASSP-29, No. 6, Dec. 1981, pp. 1128-1136.

R.C. Daniels & V. Gregers-Hansen, "Code inverse filtering for complete sidelobe removal in binary phase coded pulse compression systems," Proceedings of IEEE International Radar Conference, May 2005, pp. 256-261.

E.L.Key, E.N. Fowle & R.D. Haggarty, "A method of sidelobe suppression in phase coded pulse compression systems," Technical report +209, MIT Lincoln Laboratory, Nov. 1959.

* cited by examiner

MULTIPLICATIVE MISMATCHED FILTERS FOR OPTIMUM RANGE SIDELOBE SUPPRESSION IN BARKER CODE RECEPTION

FIELD OF THE INVENTION

The invention relates to mismatched filters for sidelobe suppression in radar systems and wireless communication systems and in many applications using Barker codes.

BACKGROUND OF THE INVENTION

Bi-phase codes are widely used for pulse compression in radar systems. Barker codes are especially preferred in these applications because it achieves the best possible MSR. It has been proved that there is no Barker code of odd length greater than 13. On the other hand, even though there is no rigorous proof about the non-existence of Barker codes of even length greater than 4, published research based on simulations show that they do not exist for lengths up to a few thousands.

Since Barker codes are short, additional means to enhance sidelobe suppression are needed. The code of length 13 achieves a MSR of only 22.28 dB which is much less than the 30 dB required in most radar applications. A peak sidelobe from a strong target echo can sometimes weaken or even completely mask the mainlobe of a smaller target echo. This motivates the need for sidelobe suppression filters or mismatched filters at the receiver. Mis-matched filters have been a subject of research in the literature for a long time. These filters achieve improved mainlobe to sidelobe ratio at the cost of some deterioration in the signal to noise ratio.

Prior research in the area of sidelobe suppression filters can be broadly classified into two general methods. In the first method, a matched filter is first used to perform the pulse compression correlation. A mismatched filter is then used in cascade with the matched filter to suppress the sidelobes. Rihaczek and Golden introduced the R-G filters which follow this methodology and have been a subject of active research ever since their introduction in 1971. The R-G filters are presented in the publication: A. W. Rihaczek and R. M. Golden, *Range Sidelobe Suppression for Barker Codes*, IEEE Transactions on Aerospace and Electronic Systems, Vol AES-7, No. 6, November 1971, pp 1087-1092. The R-G filters were further improved by Hua and Oskman who proposed a new algorithm to optimize the filter coefficients of the R-G filters. This work is presented in the publication: Chen Xiao Hua and Juhani Oskman, *A New Algorithm to Optimize Barker Code Sidelobe and Suppression Filter*, IEEE Transactions on Aerospace and Electronic Systems, Vol AES-26, No. 4, July 1990, pp 673-677. It is also described in the U.S. Pat. No. 5,070,337 by the same authors.

The second method involves directly designing the mismatched filter for the Barker code without first passing it through a matched filter. These filters have been designed using the Least Mean Square (LMS) and Linear Programming (LP) algorithms. The LMS approach can be found in the publication: M. H. Ackroyd and F. Ghani, *Optimum Mismatched Filters for Sidelobe Suppression*, IEEE Transactions on Aerospace and Electronic Systems, Vol AES-9, No. 2, March 1973, pp 214-218. The LP approach was used by Zoraster to optimize the coefficients of the filter designed to minimize the peak range sidelobe of the Barker coded waveform. The LP filters were found to be more effective in peak sidelobe suppression. This technique was introduced in the publication: S. Zoraster, *Minimum Peak Range Sidelobe Filters for Binary Phase Coded Waveforms*, IEEE Transactions on Aerospace and Electronic Systems, Vol AES-16, No. 1, January 1980, pp 112-115.

In this work, we design the mismatched filter in cascade with a matched filter. The mismatched filter is based on an implementation of a truncated and modified multiplicative inverse of the autocorrelation function of the Barker code used. The inverse filter should not be implemented directly due to its instability and unacceptable delay. Rihaczek and Golden approximated the inverse filter by expanding the transfer function as a Fourier series and then taking finite terms from the expansion. The proposed filter is fundamentally different from this approach because we apply a multiplicative expansion to approximate the transfer function of the inverse filter. In: A. T. Fam, *MFIR Filters: Properties and applications*, IEEE Trans. Acoust., Speech and Signal Processing, Vol. ASSP-29, No. 6, pp. 1128-1136, December 1981, a multiplicative expansion of IIR filters is used to generate computationally efficient multiplicative FIR filters that approximate their performance. This multiplicative expansion is applied in this work to the non-causal autocorrelation function. The key point of this invention is that following the truncation of this multiplicative expansion, a set of judiciously chosen parameters are added to the model and optimized to achieve the superior performance of the proposed mismatched filter.

DETAILED DESCRIPTION OF THE INVENTION

Figure 1:
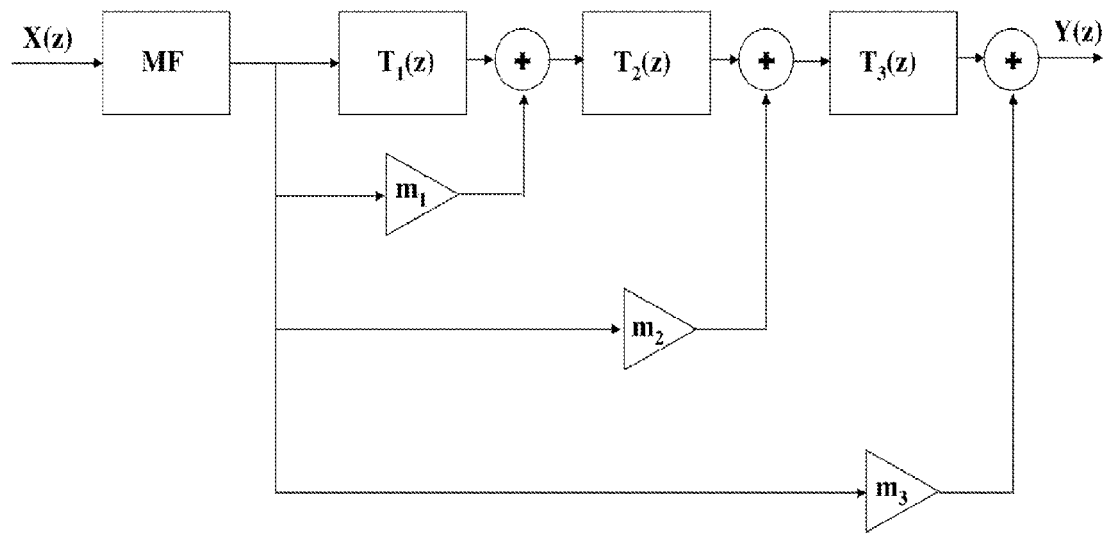
FIG. 1 is a diagram illustrating the structure of the proposed filter.

The proposed filter is designed as a sidelobe suppression filter placed in cascade with a matched filter. The starting point of designing the proposed filter is to obtain a multiplicative expansion of the inverse of the autocorrelation function R(z) produced by the matched filter. Let the incoming Barker code be X(z). Hence the matched filter transfer function is $X(z^{-1})$ and the matched filter output is the autocorrelation function given by:

$$R(z) = X(z)X(z^{-1}) \quad (1)$$

R(z) is composed of a mainlobe of height N and sidelobes of peak height 1. For notational purposes, we consider the autocorrelation function R(z) to be symmetric around the origin. Hence, we denote the sidelobes as $\Sigma S_n(z^n+z^{-n})$. In practice, the system should be made causal by adding appropriate delays. R(z) is denoted by:

$$R(z) = N + \sum S_n(z^n + z^{-n}) \quad (2)$$

$$= N\left[1 + \frac{1}{N}\sum S_n(z^n + z^{-n})\right] \quad (3)$$

Evidently, the ideal mismatched filter should be the inverse of R(z). However, such a filter would be unstable and cannot be implemented in practice. For practical applications, the transfer function of the ideal mismatched filter should be approximated by some means. We propose a multiplicative expansion of the ideal filter transfer function as shown next. We normalize R(z) with respect to N to allow for any scale factor and since the MSR is the quantity of interest. Let the transfer function of the inverse of the normalized R(z) be H(z).

$$H(z) = \frac{N}{R(z)} \quad (4)$$

$$= \frac{1}{1 + \frac{1}{N}\sum S_n(z^n + z^{-n})} \quad (5)$$

Next, we multiply the numerator and denominator by $$1 - \frac{1}{N}\sum S_n(z^n + z^{-n}).$$

This yields:

$$H(z) = \frac{1 - \frac{1}{N}\sum S_n(z^n + z^{-n})}{1 - \frac{1}{N^2}[\sum S_n(z^n + z^{-n})]^2} \quad (6)$$

The numerator and denominator is now multiplied by $$\left[1 + \frac{1}{N^2}[\sum S_n(z^n + z^{-n})]^2\right]$$

and the process is continued for as many steps as desired. H(z) is expanded in this multiplicative fashion as:

$$H(z) = \frac{\left[1 - \frac{1}{N}\sum S_n(z^n + z^{-n})\right]\left[1 + \frac{1}{N^2}[\sum S_n(z^n + z^{-n})]^2\right]}{1 - \frac{1}{N^4}[\sum S_n(z^n + z^{-n})]^4} \quad (7)$$

$$= \frac{\left[1 - \frac{1}{N}\sum S_n(z^n + z^{-n})\right]\left[1 + \frac{1}{N^2}\{\sum S_n(z^n + z^{-n})\}^2\right]\left[1 + \frac{1}{N^4}\{\sum S_n(z^n + z^{-n})\}^4\right]}{1 - \frac{1}{N^8}\{\sum S_n(z^n + z^{-n})\}^8} \quad (8)$$

$$= \ldots$$
$$= \ldots$$
$$= \ldots$$

$$= \left[1 - \frac{1}{N}\sum S_n(z^n + z^{-n})\right] \frac{\prod_{i=2}^{k}\left[1 + \frac{1}{N^{2^{i-1}}}\{\sum S_n(z^n + z^{-n})\}^{2^{i-1}}\right]}{\left[1 - \frac{1}{N^{2^k}}\{\sum S_n(z^n + z^{-n})\}^{2^k}\right]} \quad (9)$$

The choice of k depends on the number of terms that we would want to consider in our expansion. For our present purposes, we will use only three terms in the multiplicative expansion. Hence the filter transfer function will be given by equation (8). Also since $$1 - \frac{1}{N^8}\{\sum S_n(z^n + z^{-n})\}^8 \approx 1$$

The filter transfer function is redefined as:

$$H(z) = \left[1 - \frac{1}{N}\sum S_n(z^n + z^{-n})\right]\left[1 + \frac{1}{N^2}\{\sum S_n(z^n + z^{-n})\}^2\right] \quad (10)$$

$$\left[1 + \frac{1}{N^4}\{\sum S_n(z^n + z^{-n})\}^4\right]$$

In order to improve the performance of the filter, we introduce some parameters in this transfer function. The parameters either replace the constant terms in the derived equation or work in conjunction with them. The transfer function is parameterized in a way such that these parameters add flexibility in optimizing the performance of the filter. H(z) is again redefined as the parameterized transfer function as given below:

$$H(z) = \left[C_1 - \frac{1}{N + A_1}\{\sum S_n(z^n + z^{-n}) - A_1\}\right] \quad (11)$$

$$\left[C_2 + \frac{1}{(N + A_2)^2}\{\sum S_n(z^n + z^{-n}) - A_2\}^2\right]$$

$$\left[C_3 + \frac{1}{(N + A_3)^4}\{\sum S_n(z^n + z^{-n}) - A_3\}^4\right]$$

For notation purposes, we define the three terms separately as:

$$T_1(z) = \left[C_1 - \frac{1}{N + A_1}\{\sum S_n(z^n + z^{-n}) - A_1\}\right] \quad (12)$$

$$T_2(z) = \left[C_2 + \frac{1}{(N + A_2)^2}\{\sum S_n(z^n + z^{-n}) - A_2\}^2\right] \quad (13)$$

$$T_3(z) = \left[C_3 + \frac{1}{(N + A_3)^4}\{\sum S_n(z^n + z^{-n}) - A_3\}^4\right] \quad (14)$$

This filter can be implemented by connecting the three filters $T_1(z)$, $T_2(z)$ and $T_3(z)$ in cascade. To facilitate even more flexibility, we have incorporated three multipliers in our implementation of the filters. This allows us to optimize these multipliers as well in order to improve the performance of the filter. The filter structure is shown in FIG. 1. MF denotes the matched filter. We have incorporated one additional multiplier per stage ($m_1$, $m_2$ and $m_3$) to further improve its performance. The mismatched filter transfer function in its final form is given by:

$$M(z) = X(z^{-1}) \times F(z) \quad (15)$$

$$= X(z^{-1}) \times [\{[T_1(z) + m_1]T_2(z) + m_2\}T_3(z) + m_3]$$

Mismatched Filters for Individual Barker Codes

Filter for Barker Code of Length 13

To find the optimum filter for the given structure, we optimize the parameters jointly. The parameters optimized are $A_1$, $A_2$, $A_3$, $C_1$, $C_2$, $C_3$, $m_1$, $m_2$ and $m_3$. To reduce the complexity of the optimization process, we employ a multi level zooming technique. In the first pass, large step sizes are used for all the parameters to determine the approximate region of optimum performance. In the subsequent passes, finer step sizes are used to find the joint optimum values of all the parameters. The parameters are optimized to achieve the maximum sidelobe suppression. The optimization for the proposed filter is fast since the multiplicative expansion requires only 3 parameters per section, while each section almost doubles the length of the filter. Therefore, the number of parameters to optimize is roughly proportional to the logarithm of the length of the filter.

Figure 2:
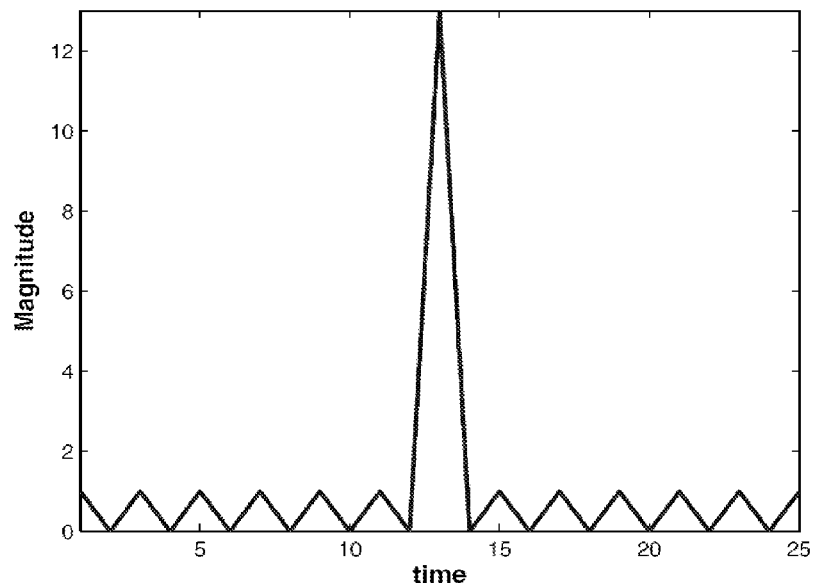
FIG. 2 is a diagram illustrating the output of the matched filter.
Figure 3:
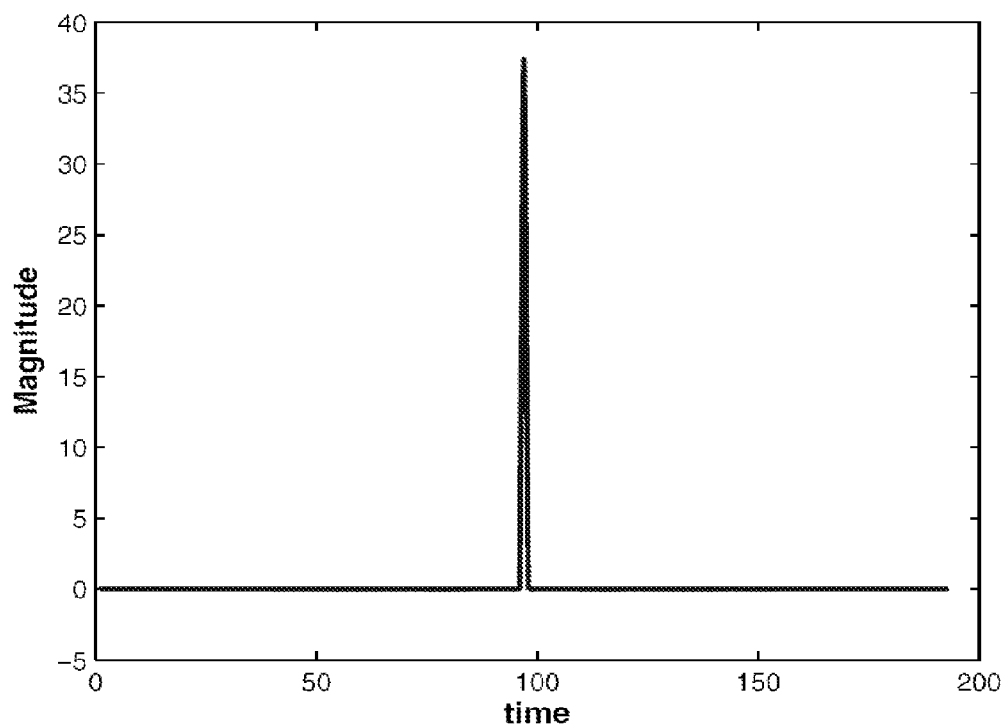
FIG. 3 is a diagram illustrating the output of the proposed filter.
Figure 4:
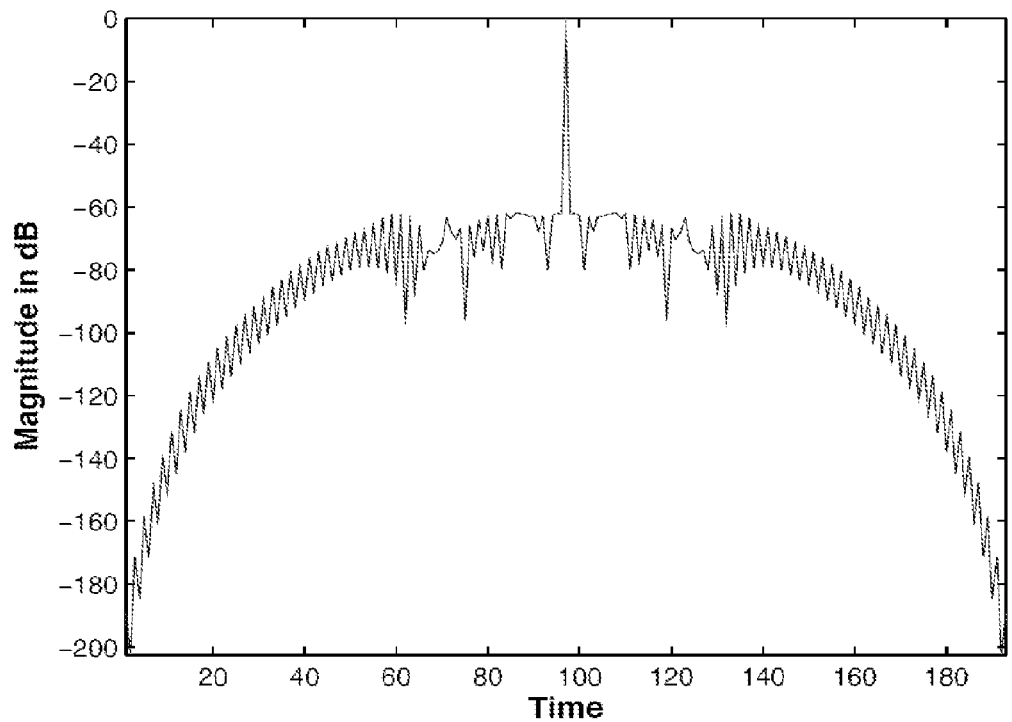
FIG. 4 is a diagram illustrating the output of the proposed filter in a logarithmic scale.

As an example, the ME output for a length 13 Barker code is shown in FIG. 2. The mainlobe is of magnitude 13 and the sidelobes are of magnitudes 1 and 0. The output of the ME is fed to a sidelobe suppression filter. The output of the resulting mismatched filter is shown in the normal and logarithmic scales in FIGS. 3 and 4, respectively. Table 1 gives the comparative performance of the different sidelobe suppression filters reported in the literature. KFH denotes the filter originally proposed by Key, Fowle and Haggarty in: E. L. Key, E. N. Fowle and R. D. Haggarty, "*A method of sidelobe suppression in phase coded pulse compression systems,*" Technical Report #209, MIT Lincoln Laboratory, November 1959. LS denotes the least square filters reported in: M. H. Ackroyd and F. Ghani, "*Optimum mismatched filters for sidelobe suppression,*" IEEE Transactions on Aerospace and Electronic Systems AES-9, pp. 214-218, March 1973. LP denotes the linear programming filters introduced by Zoraster in S. Zoraster, "*Minimum peak range sidelobe filters for binary phase coded waveforms,*" IEEE Transactions on Aerospace and Electronic Systems AES-16, pp. 112-115, January 1980. R-G denotes the filters reported by Rihaczek and Golden in: A. W. Rihaczek and R. M. Golden, *Range Sidelobe Suppression for Barker Codes*, IEEE Transactions on Aerospace and Electronic Systems, Vol AES-7, No. 6, November 1971, pp 1087-1092. $(R-G-1)_{opt13}$, $(R-G-2)_{opt13}$ and $(R-G-3)_{opt13}$ denote the improved R-G filters for the length 13 Barker code as reported by Hua and Oksman in: Chen Xiao Hua and Juhani Oskman, *A New Algorithm to Optimize Barker Code Sidelobe and Suppression Filter*, IEEE Transactions on Aerospace and Electronic Systems, Vol AES-26, No. 4, July 1990, pp 673-677. It is also described in the U.S. Pat. No. 5,070,337 by the same authors. Summary of earlier work in sidelobe suppression filters can be found in: R. C. Daniels and V. Gregers-Hansen, "*Code inverse filtering for complete sidelobe removal in binary phase coded pulse compression systems,*" Proc. IEEE Intl. Radar Conf. 2005, pp. 256-261, 9-12 May 2005.

As seen from table 1, the proposed sidelobe suppression filter, when implemented with only two stages, is superior to the other filters both in the MSR as well as the LSNR. Obviously, more stages could be added in the multiplicative expansion to improve the sidelobe suppression at the cost of a higher LSNR.

The large amount of sidelobe suppression comes at the cost of a deterioration in the signal to noise ratio (SNR) performance as compared to the matched filter output. This is evident from the results shown in table 1. Hua and Oksman achieved a MSR of 53.90 dB

TABLE 1

Comparative performance of different filters for length 13 Barker code

|  | Peak Sidelobe | LSNR |
|---|---|---|
| KFH | −45.55 dB | 0.21 dB |
| LS | −34.8 dB | 0.2 dB |
| LP | −40.0 dB | 0.18 dB |
| R-G | −45.14 dB | 0.21 dB |
| $(R-G-1)_{opt13}$ | −33.95 dB | 0.15 dB |
| $(R-G-2)_{opt13}$ | −46.42 dB | 0.14 dB |
| $(R-G-3)_{opt13}$ | −53.90 dB | 1.90 dB |
| proposed filter (1 term) | −33.97 dB | 0.2 dB |
| proposed filter (2 terms) | −60.19 dB | 0.21 dB |
| proposed filter (3 terms) | −61.88 dB | 0.21 dB | with a 1.9 dB deterioration in the SNR performance. The proposed filter not only achieves a higher MSR of 61.88 dB, but also the loss in SNR is found to be only 0.21 dB. In the current age of ultra-fast processors and ultra large scale integration in hardware chips, filter length is a factor of less concern than the degradation of the SNR performance due to the filter. The degradation in SNR performance is excellent for the proposed filter. This clearly indicates that even higher order terms can be incorporated in the multiplicative expansion of the transfer function. This will reduce the peak sidelobe level even further without degrading the SNR performance significantly.

Filters for Barker Codes of Length 11, 7 and 5

Other Barker codes that are used the most include the Barker codes of length 11, 7 and 5. The proposed mismatched filter could be used for sidelobe suppression of all these codes. Obviously, the filter parameters have to be re-optimized for each code. The number of terms in the multiplicative expansion could also be varied to achieve the desired degree of sidelobe suppression. In the previous section, as an example of the filter, we showed the optimum filter for the length 13 Barker code with three terms in its expansion. Table 2 shows the performance of the mismatched filter for different Barker codes with different number of terms in the expansion.

TABLE 2

Mismatched filtering of different Barker codes

| | | No. of terms in the expansion | | |
|---|---|---|---|---|
| Code | | 1 | 2 | 3 |
| $b_5$ | MSR | 25.10 dB | 42.98 dB | 56.12 dB |
|  | LSNR | 0.38 dB | 0.63 dB | 0.64 dB |
| $b_7$ | MSR | 21.58 dB | 35.17 dB | 46.62 dB |
|  | LSNR | 0.91 dB | 1.15 dB | 1.38 dB |
| $b_{11}$ | MSR | 23.86 dB | 35.58 dB | 46.36 dB |
|  | LSNR | 0.41 dB | 0.97 dB | 1.43 dB |
| $b_{13}$ | MSR | 33.97 dB | 60.19 dB | 61.88 dB |
|  | LSNR | 0.2 dB | 0.21 dB | 0.21 dB |

$b_n$ denotes the Barker code of length n. It can be seen from table 2 that the sidelobe suppression and LSNR both increase with number of terms in the expansion. It is of interest to note that for a given number of terms, the sidelobe suppression for $b_5$ and $b_{13}$ codes are higher than that for $b_7$ and $b_{11}$. It appears that the mismatched filter performance is better for codes that have sidelobes of +1 and 0 than those that have sidelobes of −1 and 0. The optimum filter parameters corresponding to the results described in table 2 are tabulated in tables 3, 4 and 5.

TABLE 3

Filter parameters for mismatched
filters using one term in the expansion

| Code | $A_1$ | $C_1$ | $m_1$ | MSR | LSNR |
|---|---|---|---|---|---|
| $b_5$ | −0.2 | 2.0 | 0 | 25.10 dB | 0.38 dB |
| $b_7$ | 0.5 | 1.32 | −0.12 | 21.58 dB | 0.91 dB |
| $b_{11}$ | 1.5 | 1.83 | −0.23 | 23.86 dB | 0.41 dB |
| $b_{13}$ | −0.5 | 2.0 | −0.054 | 33.97 dB | 0.2 dB |

TABLE 4

Filter parameters for mismatched filters
using two terms in the expansion

| Code | $A_1$ | $C_1$ | $m_1$ | $A_2$ | $C_2$ | $m_2$ | MSR | LSNR |
|---|---|---|---|---|---|---|---|---|
| $b_5$ | 0.05 | 0.5 | 0.77 | 0.09 | 1.0 | −0.26 | 42.98 dB | 0.63 dB |
| $b_7$ | −0.1 | 0.01 | 0.36 | 0.06 | 0.39 | 0.19 | 35.17 dB | 1.15 dB |
| $b_{11}$ | 0.06 | 0.08 | 0.1 | 0.04 | 0.21 | 0.19 | 35.58 dB | 0.97 dB |
| $b_{13}$ | 0.02 | 0.7 | 1.39 | 0.03 | 2.24 | −2.46 | 60.19 dB | 0.21 dB |

TABLE 5

Filter parameters for mismatched filters using three terms in the expansion

| Code | $A_1$ | $C_1$ | $m_1$ | $A_2$ | $C_2$ | $m_2$ | $A_1$ | $C_1$ | $m_1$ | MSR | LSNR |
|---|---|---|---|---|---|---|---|---|---|---|---|
| $b_5$ | 0.011 | 1.1 | 0.01 | 0.002 | 1.39 | 0.03 | 0.02 | 1.08 | −0.21 | 56.12 dB | 0.64 dB |
| $b_7$ | 0 | 0.9 | 0.97 | −0.04 | 1.95 | −3.0 | 0.03 | 0.45 | 0.55 | 46.62 dB | 1.38 dB |
| $b_{11}$ | −0.01 | 1.04 | 0.3 | −0.02 | 0.7 | −2.08 | 0.03 | 0.35 | 0.56 | 46.36 dB | 1.43 dB |
| $b_{13}$ | 0.0216 | 1.229 | 0.094 | 0.003 | 1.565 | 0.008 | 0.046 | 2.037 | −1.106 | 61.88 dB | 0.21 dB |

Mismatched Filters for Compound Barker Codes

Longer codes with low peak sidelobes can be generated by compounding various combinations of Barker codes. For example, consider the Barker codes of length 7 and 5 given by:

$$b_7 = \{1\ 1\ 1\ -1\ -1\ 1\ -1\} \quad (16)$$

$$b_5 = \{1\ 1\ 1\ -1\ 1\} \quad (17)$$

Either of these codes could be compounded with the other to produce a code of length 35. If the outer code is of length 5 and the inner code of length 7, the compound code is denoted by $b_5 \otimes b_7$, where $\otimes$ represents the Kronecker product. The compound code is given by:

$$\begin{Bmatrix} 1 & 1 & 1 & -1 & -1 & 1 & -1 \\ 1 & 1 & 1 & -1 & -1 & 1 & -1 \\ 1 & 1 & 1 & -1 & -1 & 1 & -1 \\ -1 & -1 & -1 & 1 & 1 & -1 & 1 \\ 1 & 1 & 1 & -1 & -1 & 1 & -1 \end{Bmatrix}$$

Let the z-transform of $b_N$ be denoted as $B_N(z)$. Compounding the length 5 code with the length 7 code could be represented in the z-domain as:

$$B_{5,7}(z) = B_7(z) \cdot B_5(z^7) \quad (18)$$

In general, if a length of code $N_1$ is compounded with another code of length $N_2$, the compound code can be represented as:

$$B_{N_1,N_2}(z) = B_{N_2}(z) \cdot B_{N_1}(z^{N_2}) \quad (19)$$

This observation allows an immediate extension of the mismatched filtering of Barker codes to compound Barker codes. If a mismatched filter for $B_N(z)$ is denoted by $M_N(z)$, from equation (19), we note that the mismatched filter for the compound code $B_{N_1,N_2}(z)$ is given as:

$$M_{N_1,N_2}(z) = M_{N_2}(z) \cdot M_{N_1}(z^{N_2}) \quad (20)$$

The transfer function of the required mismatched filter for the compound code is of the form:

$$M_{N_1,N_2}(z) = [B_{N_2}(z^{-1}) \cdot F_{N_2}(z)] \times [B_{N_1}(z^{-N_2}) \cdot F_{N_1}(z^{-N_2})] \quad (21)$$

$B_N(z^{-1})$ denotes the matched filter while $F_N(z)$ denotes the filter cascaded with it to implement the mismatched filter. $F_N(z)$ is derived using the multiplicative expansion introduced in this work. We call $F_N(z)$ a modified inverse filter. The mismatched filter of the compound code is thus implemented as a cascade of the mismatched filters of the component codes. If the mismatched filters were optimized to achieve max MSR for the individual codes, the cascade combination might not be optimal for the compound code. If needed or desired, the cascade combination could be re-optimized with the possible addition of more parameters for the compound code. It should be pointed out that the filter described in equation (21) could be implemented by changing the order of the constituent filters. For example, the two matched filters and the two modified inverse filters could be grouped together as follows:

$$\begin{aligned} M_{N_1,N_2}(z) &= [B_{N_2}(z^{-1}) \cdot B_{N_1}(z^{-N_2})] \times [F_{N_2}(z) \cdot F_{N_1}(z^{-N_2})] \\ &= B_{N_1,N_2}(z^{-1}) \times F_{N_1,N_2}(z) \end{aligned} \quad (22)$$

where $B_{N_1,N_2}(z^{-1})$ and $F_{N_1,N_2}(z)$ are the matched and modified inverse filters, respectively, for the compound code $B_{N_1,N_2}(z)$. In some applications, it could be desirable to use the form mentioned in equation (21) to obtain an intermediate output after the first block as the mismatched filter output of the inner code. This could be used to get some early information about the location of the mainlobe even though the output SNR would be low.

We show the effect of mismatched filtering on various compound Barker codes. The compound codes are obtained using several pairwise combinations from $b_{13}$, $b_{11}$, $b_7$ and $b_5$. Correspondingly, the mismatched filters are constructed using the mismatched filters for component codes described in table 2.

The results for mismatched filtering of compound Barker codes are presented in table 6. Four parameters of interest are tabulated for all combinations. They are the code length, MSR, loss in SNR due to mismatched filtering (LSNR) and the SNR at the output.

TABLE 6

Mismatched filtering result for compound Barker codes

| Inner Code | Outer code | Code length | MSR (dB) | LSNR (dB) |
|---|---|---|---|---|
| $b_{13}$ | $b_{13}$ | 169 | 61.88 | 0.42 |
| $b_{11}$ | $b_{13}$ | 143 | 45.03 | 1.62 |
| $b_7$ | $b_{13}$ | 91 | 45.59 | 1.58 |
| $b_5$ | $b_{13}$ | 65 | 53.26 | 0.83 |
| $b_{13}$ | $b_{11}$ | 143 | 46.08 | 1.63 |
| $b_{11}$ | $b_{11}$ | 121 | 46.49 | 3.06 |
| $b_7$ | $b_{11}$ | 77 | 46.47 | 2.97 |
| $b_5$ | $b_{11}$ | 55 | 46.25 | 2.01 |
| $b_{13}$ | $b_7$ | 91 | 46.18 | 1.58 |
| $b_{11}$ | $b_7$ | 77 | 40.63 | 3.01 |
| $b_7$ | $b_7$ | 49 | 40.95 | 2.92 |
| $b_5$ | $b_7$ | 35 | 45.10 | 1.95 |
| $b_{13}$ | $b_5$ | 65 | 54.29 | 0.83 |
| $b_{11}$ | $b_5$ | 55 | 46.01 | 1.97 |
| $b_7$ | $b_5$ | 35 | 46.62 | 1.93 |
| $b_5$ | $b_5$ | 25 | 53.28 | 1.25 |

Figure 5:
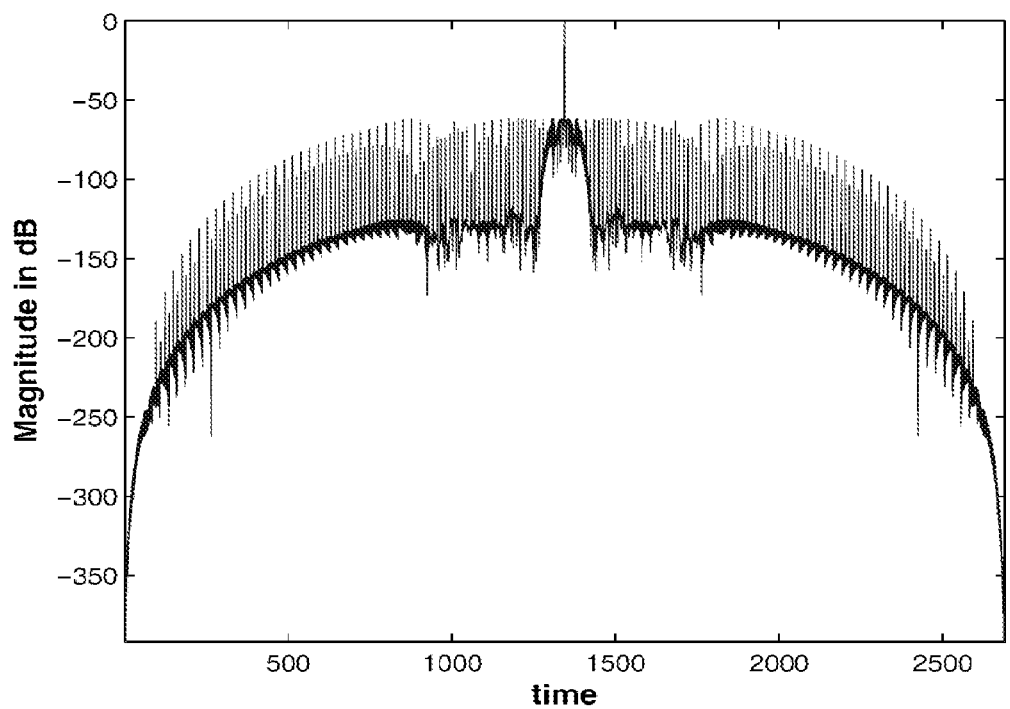
FIG. 5 is a diagram illustrating the output of the mismatched filter for $b_{13} \otimes b_{13}$ compound Barker code.

It is observed from table 6 that the proposed method of mismatched filtering of compound Barker codes preserves the MSR performance of the filter for the shorter code without any insignificant deterioration. The LSNR is approximately the sum of the LSNR's of the mismatched filters for the component codes. The best MSR performance is observed when both the outer and inner codes are Barker codes of length 13. The cascaded combination of mismatched filters for $B_{13}(z)$ and $B_{13}(z^{13})$ almost completely preserves the MSR performance of the individual filters. The code of length 169, being the longest among the ones considered, also has the best output SNR. The output of the mismatched filter for this compound code is shown in FIG. 5.

Figure 6:
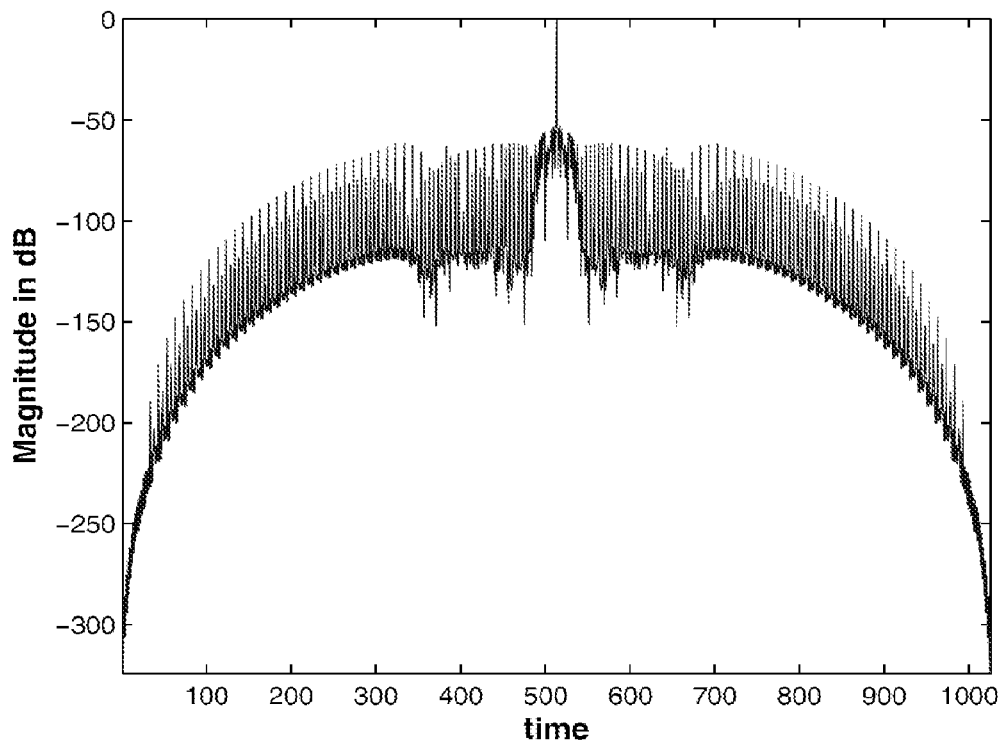
FIG. 6 is a diagram illustrating the output of the mismatched filter for $b_{13} \otimes b_5$ compound Barker code.
Figure 7:
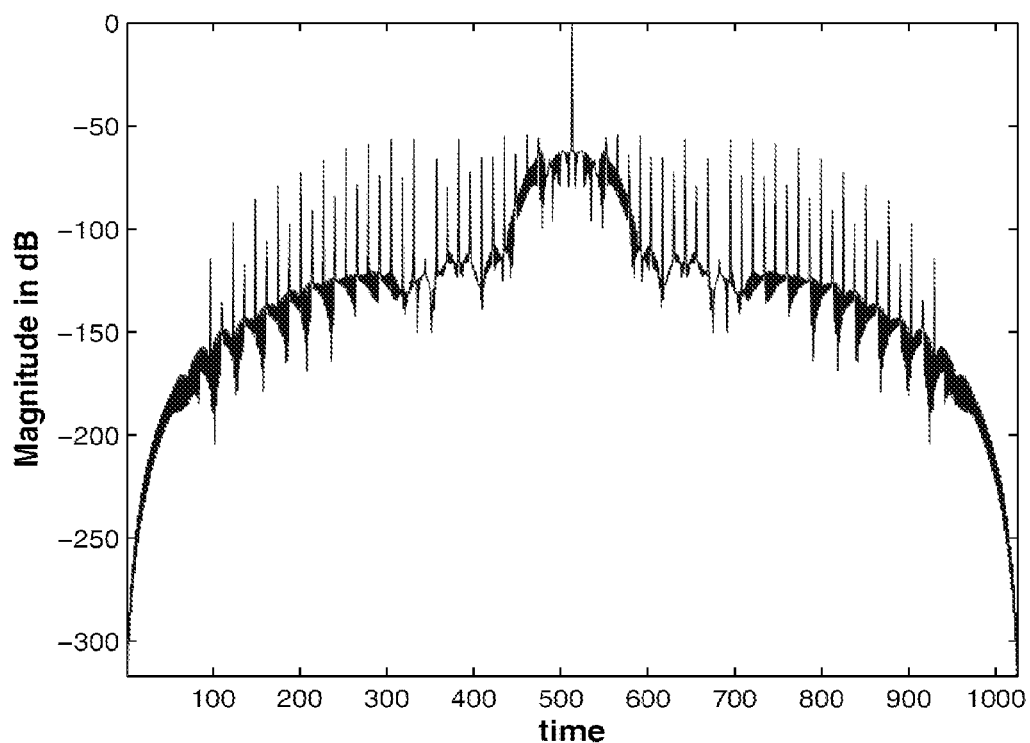
FIG. 7 is a diagram illustrating the output of the mismatched filter for $b_5 \otimes b_{13}$ compound Barker code.

For compound codes whose components are of unequal length, some changes in performance were observed when the outer and inner codes are interchanged. This is shown using compound codes of length 13 and 5 Barker codes. FIG. 6 shows the output of the mismatched filter for the $b_{13} \otimes b_5$ code while FIG. 7 shows the corresponding output for the $b_5 \otimes b_{13}$. Comparing FIGS. 6 and 7, it is observed that the higher sidelobes are more sparse when the shorter code is used as the outer code.

Hardware Requirements

Hardware Requirements of Mismatched Filters for Individual Codes

In this section we discuss the length of the proposed filter and the hardware requirements for its implementation. We have optimized the filter for only 3 stages in this paper. However, the modular structure of the proposed filter allows for as many stages to be used as needed. In this section, we develop formulas for determining the filter length as well as the number of adders and multipliers as a function of the number of stages.

Consider the filter for the length 13 Barker code. Let us denote the length of the ith stage as $L_i$. For notational purposes, the length of the matched filter is denoted as $L_0$. Evidently, $L_0$ will be the length of the Barker code which is 13 in this case. The length of each stage of the filter is approximately double that of the preceding stage and is given as:

$$L_{i+1} = 2L_i - 1 \quad (23)$$

where i=1, 2, . . .

In terms of the matched filter length $L_0$, the length of the ith stage of the filter can be shown to be:

$$L_i = 2^i(L_0 - 1) + 1 \quad (24)$$

where i=1, 2, . . .

Hence, the length of the mismatched filter with k stages is given by:

$$L_m(k) = \sum_{i=1}^{k} L_i - (k - 1) \quad (25)$$

The (k−1) term is subtracted to account for the reduction in length by 1 due to convolution each time a new stage is added to the existing stages. The length of the mismatched filter evaluates to:

$$L_m(k) = \sum_{i=1}^{k} [2^i(L_0 - 1) + 1] \quad (26)$$

$$= (L_0 - 1)(2^{k+1} - 2) + n - (n - 1) \quad (27)$$

$$= (L_0 - 1)(2^{k+1} - 2) + 1 \quad (28)$$

Finally the total filter length is calculated as a function of the number of stages n, taking into account the matched filter of length $L_0$ at the front end. The total filter length is given by:

$$L(k) = [(L_0 - 1)(2^{k+1} - 2) + 1] + L_0 - 1 \quad (29)$$

$$= (L_0 - 1)(2^{k+1} - 2) + L_0 \quad (30)$$

Figure 8:
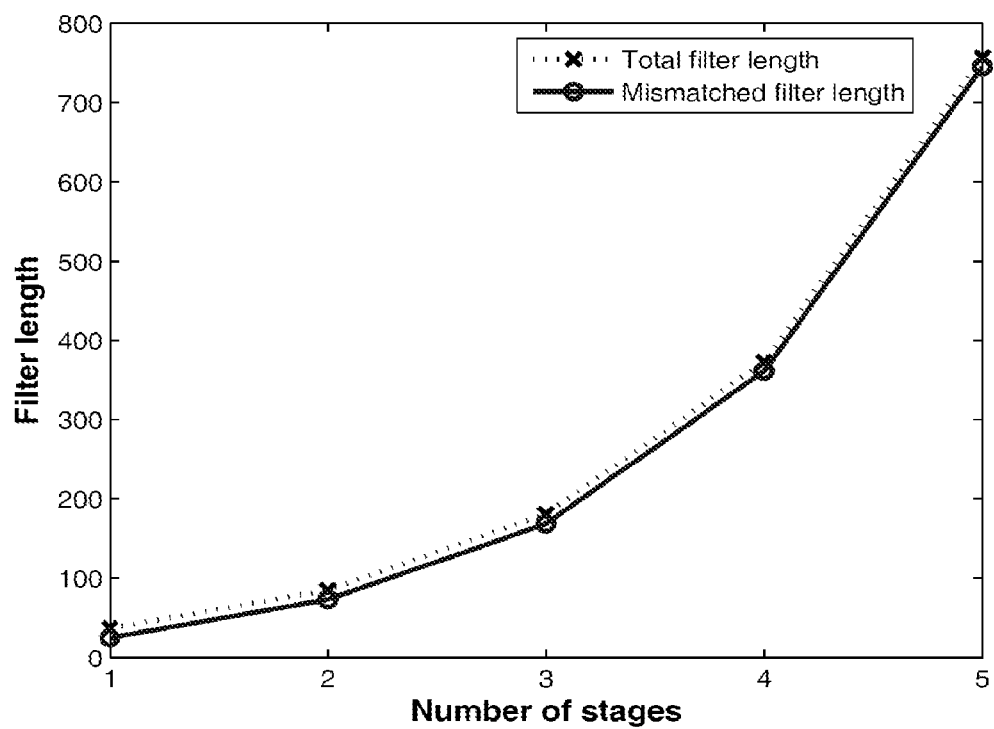
FIG. 8 is a diagram illustrating the mismatched filter length and total filter length as functions of the number of stages for the length 13 Barker code. The dotted graph results from adding the length of the matched filter (13 in this case) to the solid line representing the length of the mismatched filter.

As an example, we show the hardware requirements for the mismatched filters of the length 13 Barker code. The values for $L_m$ and L for different number of stages k are shown in table 2 and plotted in FIG. 8.

Next, we enumerate the number of adders and multipliers required for the proposed filter. For a Barker code of length n, the matched filter requires (n−1) adders irrespective of the number of stages in the mismatched filter. As evident from (11), the number of adders for the first stage of the mismatched filter is {1+(n−1)}. Similarly the number of adders in the second and third stages are {1+(n−1)×2} and {1+(n−1)× 4}, respectively. It can easily be observed that the number of adders from the ith stage is given by:

$$a(i) = 1 + (n-1) \times 2^{i-1} \quad (31)$$

where i=1, 2, . . .

Therefore, the total number of adders required for k stages of the filter is given by:

$$A(k) = (n - 1) + k + \sum_{i=1}^{k} (n - 1) \times 2^{i-1} \quad (32)$$

$$= (n - 1) + k + (n - 1)(2^k - 1) \quad (33)$$

$$= k + (n - 1) \times 2^k \quad (34)$$

Figure 9:
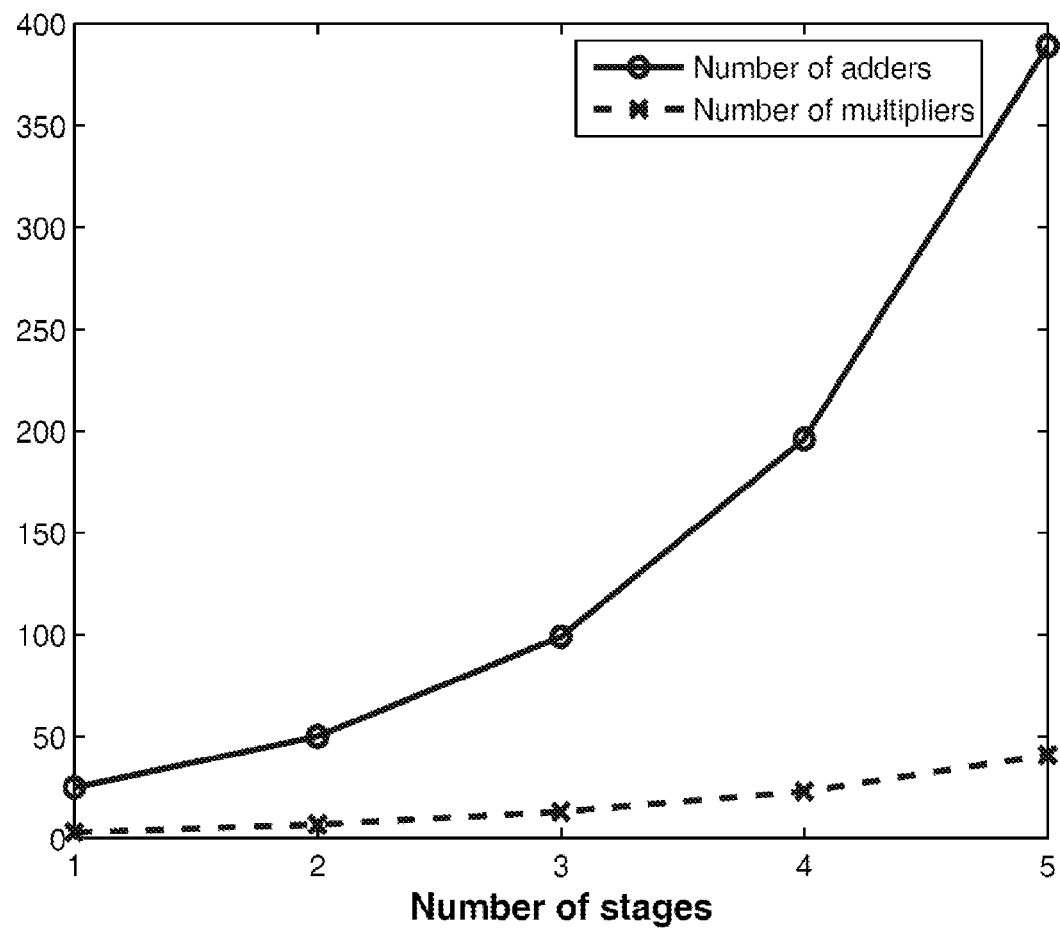
FIG. 9 is a diagram illustrating the number of adders and multipliers required for the mismatched filter for $b_{13}$ as a function of the number of stages.

This includes the (n−1) adders from the matched filter (stage 0) placed before the mismatched filter. The number of adders for a mismatched filter of $b_{13}$ is shown in FIG. 9 and table 7 as a function of the number of stages.

Similar calculations can be done to enumerate the number of multipliers required for implementing the filter. Proceeding similarly as in the case of adders, it can be shown from (11) that the number of multipliers required for the ith stage is given by:

$$m(i) = 3 + 2^{i-1} \qquad (35)$$

where $i=1, 2, \ldots$

Therefore, the total number of multipliers required for a filter with k stages is given by:

$$M(k) = 3k + 2^k - 1 \qquad (36)$$

The number of multipliers for the filter for $b_{13}$ is shown in FIG. 9 as well as in table 7 as a function of the number of stages.

TABLE 7

Filter lengths and hardware requirements for $b_{13}$ as a function of number of stages

| Stages | Mismatched filter length, $L_m$ | Total filter length, L | Adds per output, A | Mult. per output, M |
|---|---|---|---|---|
| 1 | 25 | 37 | 25 | 4 |
| 2 | 73 | 85 | 50 | 9 |
| 3 | 169 | 181 | 99 | 16 |
| 4 | 361 | 373 | 196 | 27 |
| 5 | 745 | 757 | 389 | 46 |

The proposed filter with only 3 multiplicative expansion terms, cascaded with the matched filter, results in a total filter length of 181. However, the number of non zero coefficients is much smaller resulting in 99 additions and 16 multiplications per output.

Hardware Requirements of Mismatched Filters for Compound Codes

The length of the mismatched filters and the required number of adders and multipliers for different compound codes are tabulated in table 8. Due to the factored representation of the mismatched filter for the compound codes, the number of adders and multipliers per output is the sum of the number of adders and multipliers, respectively for the individual mismatched filters. The required numbers are also shown in table 8.

It is to be noted that the number of multipliers required per output depends only on the number of stages of the mismatched filter and not on the length of the code used.

TABLE 8

Hardware requirements for compound mismatched filters

| Inner Code | Outer code | Total filter length | # mul. per o/p | # add per o/p |
|---|---|---|---|---|
| $b_{13}$ | $b_{13}$ | 2521 | 32 | 198 |
| $b_{11}$ | $b_{13}$ | 2131 | 32 | 182 |
| $b_7$ | $b_{13}$ | 1351 | 32 | 150 |
| $b_5$ | $b_{13}$ | 961 | 32 | 134 |
| $b_{13}$ | $b_{11}$ | 2131 | 32 | 182 |
| $b_{11}$ | $b_{11}$ | 1801 | 32 | 166 |
| $b_7$ | $b_{11}$ | 1141 | 32 | 134 |
| $b_5$ | $b_{11}$ | 811 | 32 | 118 |
| $b_{13}$ | $b_7$ | 1351 | 32 | 150 |
| $b_{11}$ | $b_7$ | 1141 | 32 | 134 |
| $b_7$ | $b_7$ | 721 | 32 | 102 |
| $b_5$ | $b_7$ | 511 | 32 | 86 |
| $b_{13}$ | $b_5$ | 961 | 32 | 134 |
| $b_{11}$ | $b_5$ | 811 | 32 | 118 |
| $b_7$ | $b_5$ | 511 | 32 | 86 |
| $b_5$ | $b_5$ | 361 | 32 | 70 |

Even though the total filter length turns out to be large especially for the longer codes, the efficient multiplicative structure allows these filters to be implemented with small number of adders and multipliers as shown in table 8.

In the hardware calculations tabulated in table 8, three terms (i.e. k=3) are considered for the filters for both the inner and outer codes. It was noted in the previous section that after mismatched filtering, the MSR performance of the compound code does not improve over that of the shorter component code. We note from table 2 that using two stages of the filter for $b_{13}$ results in a higher MSR compared to three stages for the shorter Barker codes. Therefore, when a shorter Barker code is compounded with b13 and three stages are used in the filter for the shorter code, it is sufficient to use only two stages in the modified inverse filter for $b_{13}$. This results in reductions in the number of adders, multipliers and most importantly, the processing delay, without any additional degradation in the MSR performance.

What is claimed is:

1. A method for suppressing one or more sidelobes of a matched filter output for a pulse compression code, the method comprising:
   (a) filtering, via a first filter, a matched filter output, wherein the coefficients of the first filter is represented as a first z domain polynomial series by subtracting a second term from a first term, the first term being a first adjustable parameter and the second term being a function of a z domain polynomial series representation of sidelobes of the matched filter output; and
   (b) filtering, via a second filter, an output of the first filter, the second filter comprising one or more filter stages wherein each of the one or more filter stages is represented by a separate z domain polynomial series as a sum of a third term and a fourth term,
   the third term being a second adjustable parameter and the fourth term being a function of the z domain polynomial series representation of the side-lobes raised to an integer power of 2.

2. The method of claim 1 further comprising adjusting one or more coefficients of the first filter via the first adjustable parameter for a significantly high mainlobe to sidelobe ratio of an output of the second filter.

3. The method of claim 1 further comprising adjusting one or more coefficients of the one or more filter stages of the second filter via the second adjustable parameter of one or more of the separate z domain polynomial series for a high mainlobe to sidelobe ratio of an output of the second filter.

4. The method of claim 1 wherein at least one of the second term and the fourth term includes one or more adjustable parameters.

5. The method of claim 4 further comprising optimizing the one or more adjustable parameters for a significantly high mainlobe to sidelobe ratio of an output of the second filter.

6. The method of claim 1 wherein the pulse compression code is one of a Barker code, a compound Barker code and a minimum peak sidelobe (MPS) code.

7. The method of claim 1 wherein the first filter and the second filter are implemented using adders and multipliers.

8. A system for suppressing one or more sidelobes of a matched filter output for a pulse compression code, the system comprising:
   a first filter, connected to and processing an output of a matched filter, coefficients of the first filter being represented as a first z domain polynomial series by subtracting a second term from a first term, the first term being a first adjustable parameter and the second term being a function of a z domain polynomial series representation of sidelobes of the matched filter output; and a second filter, connected to and processing the output of the first filter, the second filter comprising one or more filter stages wherein each of the one or more filter stages is represented by a separate z domain polynomial series as a sum of a third term and a fourth term, the third term being a second adjustable parameter and the fourth term being a function of the z domain polynomial series representation of the side-lobes raised to an integer power of 2.

9. The system of claim 8 wherein at least one of the second term and the fourth term includes one or more adjustable parameters.

10. The system of claim 8 further comprising a first multiplier connected in parallel between the matched filter and an output of the first filter.

11. The system of claim 8 further comprising one or more second multipliers connected in parallel between the matched filter and an output of a filter stage of the second filter.

12. The system of claim 8 wherein a plurality of adders and multipliers are used for implementation of the first and the second filters.

13. The system of claim 10 wherein the first multiplier is chosen such that a mainlobe to sidelobe ratio of an output of the second filter is significantly high.

14. The system of claim 11 wherein the one or more second multipliers are chosen such that a mainlobe to sidelobe ratio of an output of the second filter is significantly high.

15. The system of claim 8 wherein the pulse compression code is one of a Barker code, a compound Barker code and a minimum peak sidelobe (MPS) code.

16. The system of claim 8 further comprising one or more delay units.

* * * * *